US009581624B2

(12) United States Patent
Rostron et al.

(10) Patent No.: US 9,581,624 B2
(45) Date of Patent: Feb. 28, 2017

(54) CORONA AVOIDANCE ELECTRIC POWER LINE MONITORING, COMMUNICATION AND RESPONSE SYSTEM

(71) Applicant: Southern States, LLC, Hampton, GA (US)

(72) Inventors: Joseph R. Rostron, McDonough, GA (US); Joshua D. Keister, Atlanta, GA (US); Harold Dean Allen, III, Senoia, GA (US)

(73) Assignee: Southern States, LLC, Hampton, GA (US)

( * ) Notice: Subject to any disclaimer, the term of this patent is extended or adjusted under 35 U.S.C. 154(b) by 165 days.

(21) Appl. No.: 14/463,233

(22) Filed: Aug. 19, 2014

(65) Prior Publication Data

US 2016/0054363 A1 Feb. 25, 2016

(51) Int. Cl.
*G01R 21/00* (2006.01)
*G01R 31/08* (2006.01)
(Continued)

(52) U.S. Cl.
CPC ......... *G01R 22/063* (2013.01); *G01R 21/06* (2013.01); *G01R 15/142* (2013.01);
(Continued)

(58) Field of Classification Search
CPC ................................ G01R 31/08; G01R 21/00
(Continued)

(56) References Cited

U.S. PATENT DOCUMENTS 5,181,026 A * 1/1993 Granville ............. G01R 15/183
324/96
7,283,915 B2 * 10/2007 Saha .................... G01R 31/088
702/59
(Continued)

FOREIGN PATENT DOCUMENTS

EP 0314850 B1 3/1994
EP 2693223 A1 2/2014
WO WO8302841 A1 8/1983

OTHER PUBLICATIONS

PCT/US2014/051689 Inernational Search Report and Written Opinion.

*Primary Examiner* — Thomas Valone
(74) *Attorney, Agent, or Firm* — Michael J. Mehrman; Mehrman Law Office

(57) ABSTRACT

An electric power line monitoring, communication and response system schedules the transmission of packets to occur during voltage zero-crossing intervals when corona is minimized. The transmitters may be located at high voltage hanging directly from the power line conductors along with associated current transformers and voltage sensors. A system of these transmitters distributed throughout the power grid communicate with each other in a data-forward manner to bring complete, real-time current and voltage waveform, device status and fault monitoring information to data aggregation waypoints, such as transmission substations where supervisory control and data acquisition (SCADA) equipment is installed. The power line monitoring data is then transmitted from the data waypoints to a central monitoring and control center, typically using existing SCADA equipment, to provide h detailed power line monitoring data for a large number of data monitoring points distributed throughout the power grid.

20 Claims, 10 Drawing Sheets

(51) Int. Cl.
  *G01R 22/06*  (2006.01)
  *G01R 21/06*  (2006.01)
  *G01R 35/00*  (2006.01)
  *G01R 15/14*  (2006.01)
  *G01R 19/25*  (2006.01)

(52) U.S. Cl.
  CPC ........ *G01R 15/144* (2013.01); *G01R 19/2513* (2013.01); *G01R 35/005* (2013.01)

(58) Field of Classification Search
  USPC .................................................. 324/536, 537
  See application file for complete search history.

(56) References Cited

U.S. PATENT DOCUMENTS

| | | |
|---|---|---|
| 2008/0077336 A1 | 3/2008 | Fernandes |
| 2011/0011623 A1 | 1/2011 | Hyde et al. |
| 2012/0029871 A1* | 2/2012 | Spillane .................. H02G 1/02 |
| | | 702/158 |

* cited by examiner

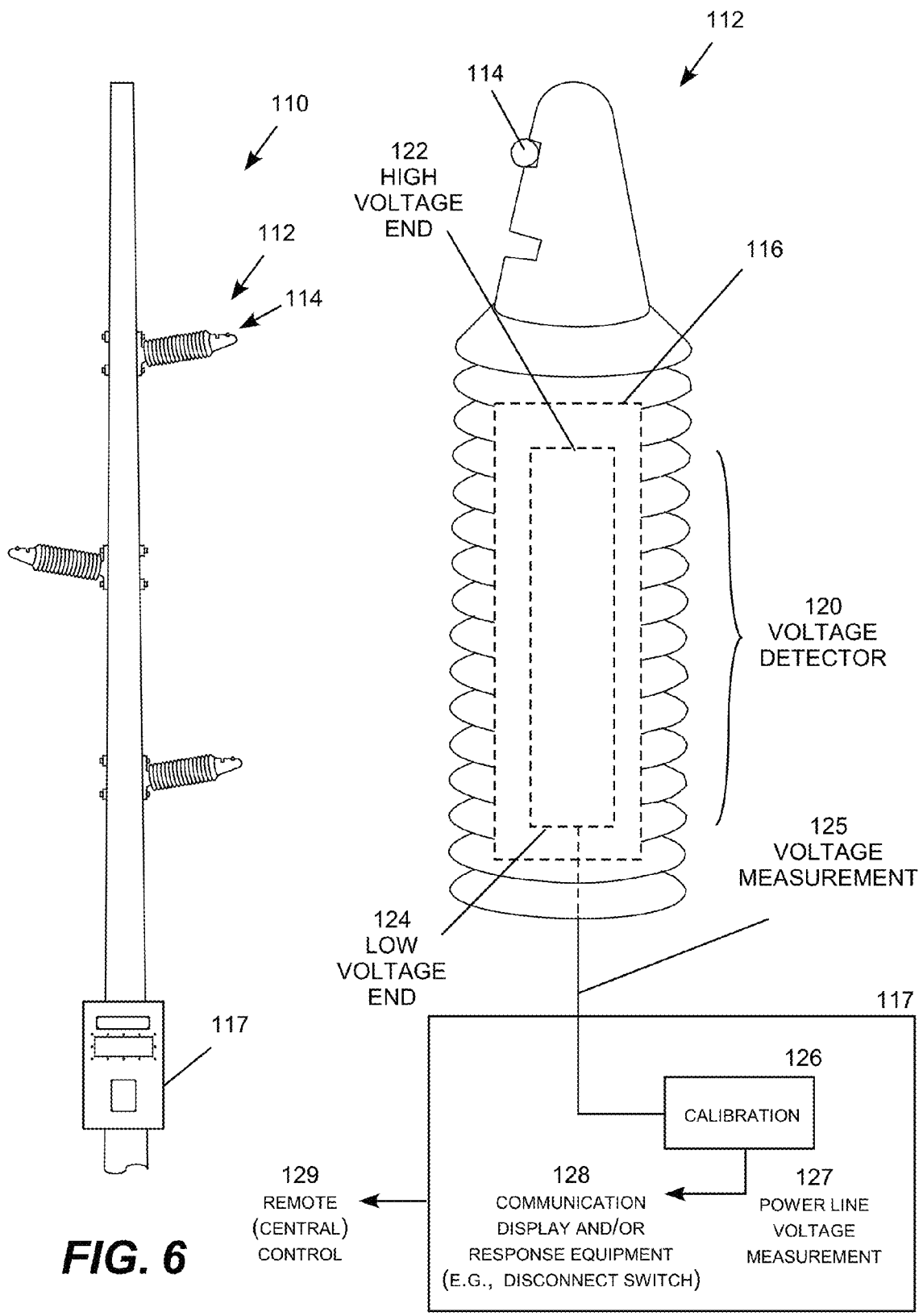

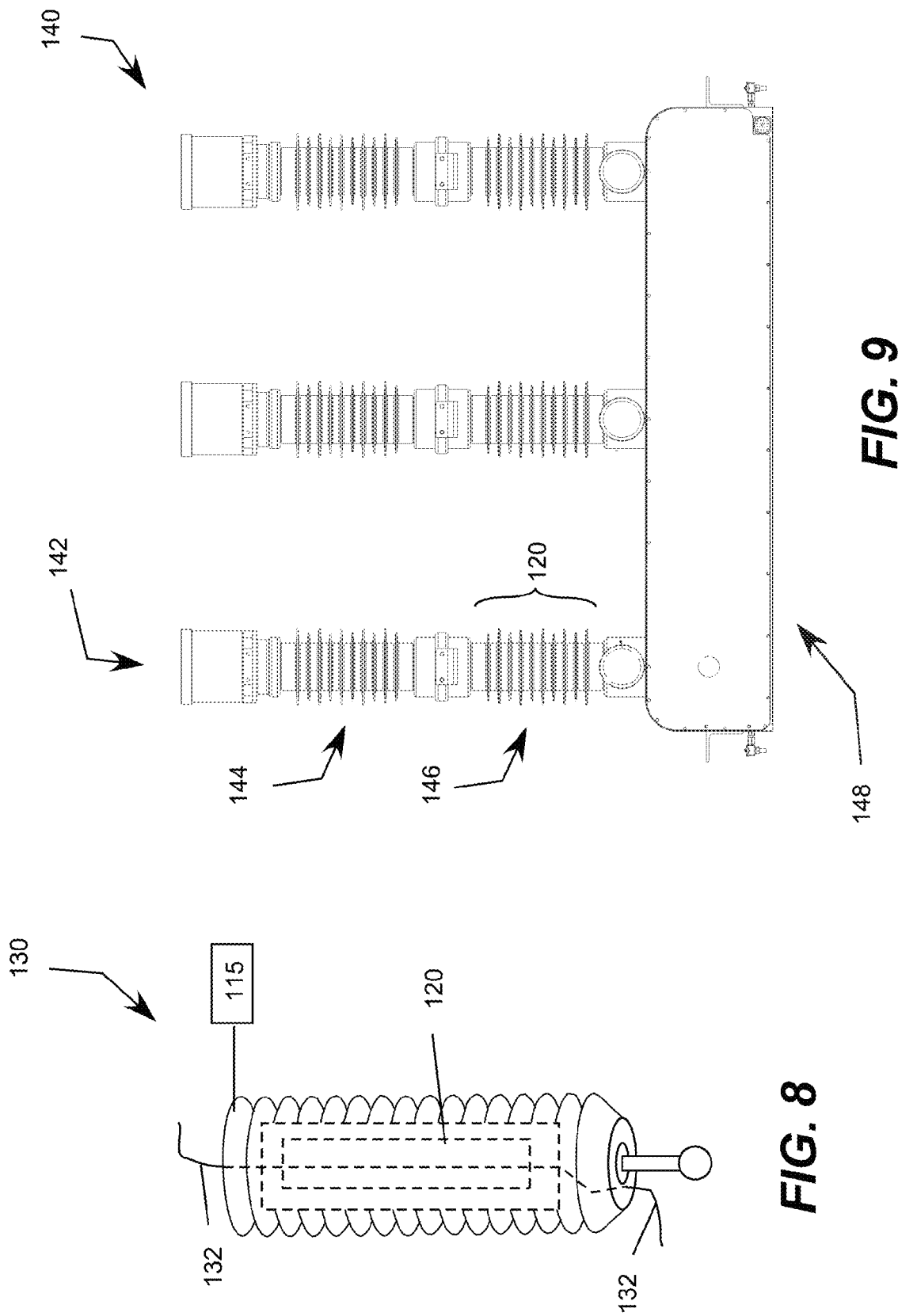

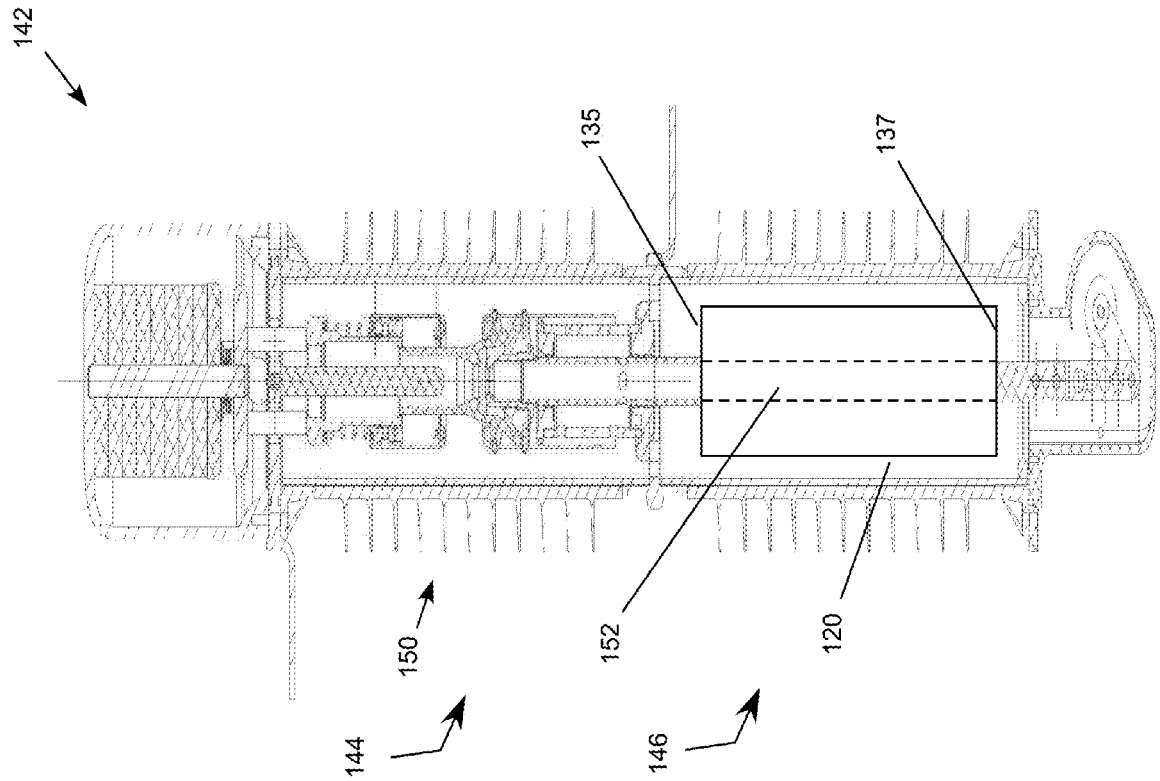

CORONA AVOIDANCE ELECTRIC POWER LINE MONITORING, COMMUNICATION AND RESPONSE SYSTEM

TECHNICAL FIELD

The present invention is directed to electric power systems and, more particularly, to an electric power line monitoring and response system that reliably transmits power line monitoring data in the presence of high voltage corona.

BACKGROUND

Corona from high voltage lines is a known problem and well established as a design criteria for high voltage electric power lines. Years ago a test known as the Radio Influence Voltage (RIV) test was implemented in response to corona interference causing AM radios in automobiles to become unusable while driving under and near power lines. Corona interference is known to become significantly worse in the presence of bad weather, such as rain and fog. The implementation of the RIV testing with associated electric power line design criteria helped improve the situation. When the original RIV approach was implemented there were no electric power sensors operating at high voltage, but the electric utility world has changed in that a variety of electric power sensors operating at high voltage are now readily available.

Avoiding corona when transmitting data along high voltage power lines can be facilitated by transmitting data at higher frequencies where the corona interference is less intense. While this may appear to be a good technical solution for many design objectives, the FCC only allows relatively low power levels to be transmitted in these unlicensed frequency channels. The combination of utilizing low power communications at these relatively high frequencies results in relatively shorter range data transmission capability, in some cases only a mile or two in dry weather and much less in heavy rain or fog. Reliable communications under these constraints therefore requires a large number of repeaters and specialized designs to focus the transmission of data packets directly between sources and receivers.

Another design concern arises with the placement of communication antennas. Electric power line data sensors, such as current transformers and voltage monitors, are ordinarily located in the high voltage field immediately next to the power line conductors, which also happens to be the location where the corona interference is most intense. Locating the antenna at high voltage within a corona field effectively de-tunes the antenna and changes its communication pattern degrading its ability to transmit and receive data. Corona interference created by power lines is also known to cause voltage spikes that can damage sensitive and expensive transmitter and receiver electronics. Providing the antennas with physical corona protection, such as shielding, generally makes antennas much larger and cumbersome. In addition, electronic filtering is largely impractical when the corona frequencies occur in the same range as the communication transmission frequency. As a result, there is a persistent need for a better solution for monitoring, communicating and responding to electric power line data.

SUMMARY OF THE INVENTION

The invention solves the problems described above through an electric power system, and an electric power line monitoring and response system and associated method for the electric power system. The electric power system includes an electric power line carrying an electric power waveform experiencing periodic low voltage periods associated with voltage zero-crossings. The monitoring and response system includes a number of distributed power line monitors, each located within the high voltage field of an associated conductor of the power line and configured to measure power line monitoring data corresponding to its respective conductor. Associated power line data transmitters, which are also located within the high voltage field of the high voltage conductor, are operably connected to a respective power line monitor. The transmitters are configured to receive, store and transmit the power line monitoring data from a respective power line monitor during the low voltage periods to minimize corona interference with the transmission.

In a particularly embodiment, the data transmitters send the power line monitoring data at a relatively moderate RF frequency under about 2.0 GHz, for example 325 MHz. In addition, each power line monitor may include individual phase monitors, each associated with a separate phase conductor of the power line, configured to transmit phase power line monitoring data to an associated data transmitter. In this case, the phase monitors may be operably connected to their associated data transmitter by a conductor or a relatively high frequency RF channel operating above about 2.0 GHz.

In a power grid configuration, the power line data transmitters are configured to transmit cumulative power line data in a data-forward configuration to a data waypoint. More specifically, groups of the power line data transmitters may each be configured to transmit cumulative power line data in a data-forward configuration to a data waypoint. The data waypoints, in turn, are configured to transmit cumulative power monitoring data from its respective group of power line data transmitters to a control center.

The power system may also include response equipment and the control center and/or local controllers may operate the response equipment based at least in part on the power line monitoring data. For example, the response equipment includes switching equipment operated to isolate a fault detected through analysis of the power line monitoring data. As other examples, the response equipment may include capacitor banks, voltage regulators, power interchanges, distributed generators, load control switches, and interruptable loads.

In view of the foregoing, it will be appreciated that the present invention provides an improved electric power line monitoring and response system that reliably transmits power line monitoring data in the presence of high voltage corona. The specific structures and techniques for accomplishing the advantages described above will become apparent from the following detailed description of the embodiments and the appended drawings and claims.

BRIEF DESCRIPTION OF THE DRAWINGS

FIG. 6 is a front view of a phase-over-phase electric power pole providing an illustrative embodiment of a voltage detector located inside a line insulator in an embodiment of the invention.

FIG. 7 is a conceptual illustration of the voltage detector located inside a line insulator FIG. 8 is a conceptual illustration of an alternative embodiment in which the voltage detector is located inside a hanging line insulator.

FIG. 9 is a conceptual illustration of an alternative embodiment in which the voltage detector is located inside a circuit interrupter.

FIG. 10 is a sectional view showing the internal location of the voltage detector located within a circuit interrupter.

DETAILED DESCRIPTION OF EXEMPLARY EMBODIMENTS

Figure 1:
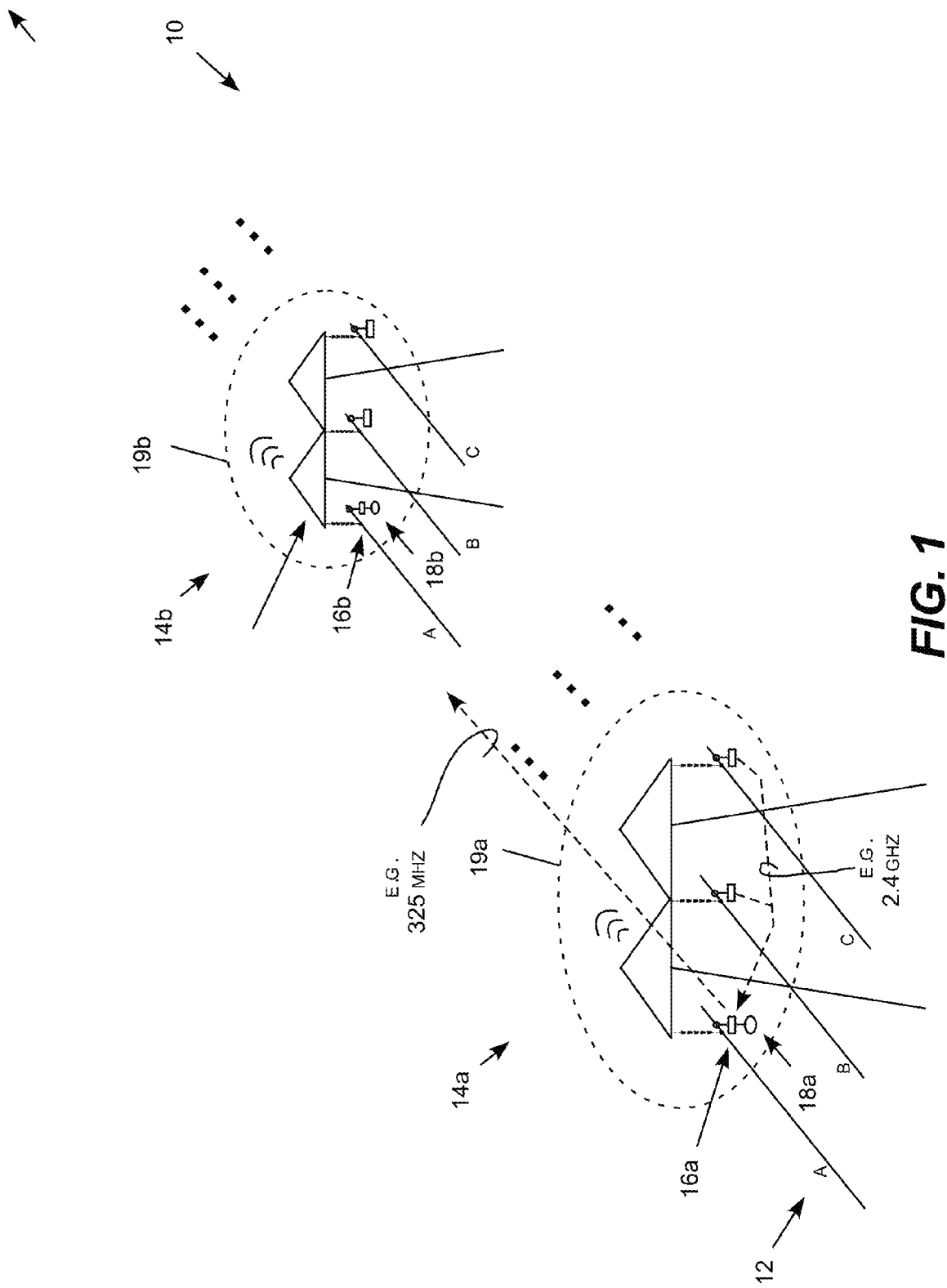
FIG. 1 is a conceptual diagram of a system for RF communication in the presence of high voltage corona.

The present invention may be embodied in an electric power line monitoring and response system that schedules the transmission of packets to occur during voltage zero-crossing intervals when corona is minimized. This allows the transmitters to be located at high voltage, for example where the transmitters hang directly from the power line conductors along with the associated current transformers and voltage sensors. This allows the transmitters to chirp data packets containing waveform, device status, and fault data between high corona events.

In a particular embodiment, a system of these transmitters distributed throughout the power grid communicate cumulative power line data in a data-forward manner to bring complete, real-time current and voltage waveform, device status and fault monitoring information to data aggregation waypoints, such as transmission substations where supervisory control and data acquisition (SCADA) equipment is installed. The data waypoints relay the power line monitoring data to a central monitoring and control center, typically using the existing SCADA equipment installed at the substations. This provides the control center with detailed power line monitoring data for a large number of data monitoring points distributed throughout the power grid, potentially at a range of transmission and distribution voltages.

The control center, as well as substations and remote equipment located out on the power lines, may therefore be controlled to operate in respond to faults, overloads, voltage sags, power factor variations, load imbalances, and other types of power system conditions revealed by the detailed power line monitoring obtained from a large number of monitoring sites distributed throughout the power grid. Example response actions include switch operation including fault isolation and operation of power devices, such as capacitor banks, voltage regulators, power interchanges, distributed generators, and load control switches, as well as scheduling of power transactions, disconnection of interruptable loads, and any other potential response actions available in the "smart" grid environment.

Communication range increases with low frequencies. To provide a rough guide, at 5 W output power the typical communication ranges are about 20 miles at 325 MHZ, about 7 miles at 900 MHz, and about one mile at 2.4 GHz. It is therefore desirable to transmit data at lower frequencies to achieve longer range but the corona interference is more intense in the moderate frequency ranges up to about 2.0 GHz. Utilities have a 325 MHz licensed communication channel, but transmitting in this frequency channel from locations within the high voltage fields of the power lines requires significant power to punch through the corona interference.

The corona avoidance techniques of the present invention allow the power line data collection equipment (typically current transformers and voltage detectors) as well as the data transmission equipment to be located at the prevailing system voltage, for example hanging directly from the power line conductors within he high voltage field created by the power line. The data collection and transmission points transmit the data packets from their high voltage locations between high corona events in a data-forward manner to avoid corona interference, without requiring antenna corona protection or filtering. This allows the data transmitters to utilize a moderate frequency, relatively high range communication frequency, such as 325 MHz, that would otherwise be blocked by corona interference. Utilizing the moderate data transmission frequency, in turn, allows relatively long spacing between data monitoring points on the order of tens of miles at a relatively low power requirement (e.g. 5 W), which is a major improvement over the single- or sub-mile separation that would be required at a higher frequency channel, such as 2.4 GHZ, that is less sensitive to corona interference.

High voltage monitoring data for an electric power system is typically transmitted by utility-grade supervisory control and data acquisition (SCADA) communication equipment installed at a relatively small number of locations, such as transmission substations and other strategic locations throughout an electric power grid. The SCADA system usually communicates system monitoring data from these locations to a central control center, which coordinates system analysis and control operations. While conventional SCADA systems provide monitoring data for the major system infrastructure points, mainly transmission substations and major interconnection points, detailed power line information such as voltage and current waveform data "out on the lines" away from the major substations is typically not available.

Electric power monitoring data is inherently involves relatively low data rates due to the limited amount of information required to describe the electrical condition of an electric power line at particular monitoring locations along the lines (e.g., three-phase current values, a system voltage value, fault data, and device status indicators for discrete data monitoring points at discrete time intervals at rates in the millisecond range). As corona ebbs and flows with the system voltage (60 Hz in the U.S. and 50 Hz in other parts of the world), low-corona windows for data transmission occur twice every cycle (i.e., every 8.3 ms at 60 Hz, every 10 ms at 50 Hz). Status of protection devices, fault detection, fault direction, and power waveform data can be easily transmitted in summarized data packets at this rate. But waveform monitoring requires point-on-waveform data at multiple time points along the cyclical 60 Hz or 50 Hz waveform, such as three-phase current and voltage samples taken every millisecond. Due to high-corona events occurring twice per system voltage cycle, corona interference makes transmitting data packets at any rate greater than about twice the system voltage frequency problematic. Simply transmitting data packets into the teeth of the corona interference at a communication frequency that is highly sensitive to corona interference, such as the 325 Mhz frequency channel reserved for utilities, results in the continual loss of data packets during high-corona events. This exposes the communication electronics to corona-induced damage while requiring systematic re-transmission of lost data packets, thus reducing bandwidth and communication system reliability.

To provide the desired level of reliability, utility operators generally avoid relying on public communication networks, such as cellular telephone networks, to transmit critical system data. While the higher frequency cellular telephone communication channels, such as 2 GHz, are generally less sensitive to corona interference, they are subject to weak links due to other types of interference requiring more time for communication and frequent repeaters capable of intelligently routing critical information. For example, the line-of-sight along high voltage power lines can often be blocked by small objects, such as pine needles, which impose greater interference on higher frequency communications in the GHz ranges where the wavelengths are close in size to these types of obstructions. Moderate frequency channels, such as 325 MHz, also have a greater ability to bend or reflect around corners, reducing the need for line-of-sight repeaters. Major SCADA locations, such as transmission substations are frequently located many miles apart, making the range difference at 325 MHz versus the GHz ranges very significant as a practical factor in repeater spacing. Minimizing the number of repeaters and intelligent routers in a proprietary communication network reduces the cost and complexity of the system. These factors combine to make corona interference an important design consideration for electric utility monitoring equipment located along power lines away from the major SCADA locations.

It has also been determined that radio noise spontaneously occurs on some high voltage power lines in dry weather starting around 1.5 GHz for receivers located 90 feet away (source unknown—antenna pointing toward space). The interference often becomes significant at about 2.5 GHz for receivers located 60 feet away, and can remain significant up to 6 GHz. With heavy rain (0.3 inches/hour), the radio noise level often increases by 17 dB over the average long-term fair weather value. It may then be necessary to add as much as 24 dB to the communication power above the average power needed during long-term fair weather to transmit critical communication during heavy rain events. And, of course, fault and other power outage data can be especially critical during heavy rain storms.

As the wireless receiver sensitivity levels surpass thermal noise levels, reliable operation of smart grid Distributed Generating System (DGS) wireless communication and control devices demands consideration of the power line produced noise spectrum. The power line noise spectrum varies based on voltage and current of transmission lines and load characteristics. The electrical-noise environment is anticipated to be more severe in a DGS than in a Conventional Electrical Power System (CEPS) due to the frequent changes in power distribution routing.

The moderate frequency channel at 325 MHz reserved for utilities has an intrinsically longer range than higher frequencies used for cellular telephone communications making the moderate frequency channel suitable for relatively low-power, peer-to-peer utility communications. Corona interference is known to be particularly intense, however, at the moderate frequency ranges including 325 MHz.

While most measurable noise occurs at frequencies less than 200 MHz, the corona noise spectrum extends up to about 2000 MHz (2 GHz). The distance of RF communication is significantly reduced by noise in the environment. Corona from high voltage systems creates this noise and blocks the signal. This is severely aggravated when transmitting from a high voltage location. This is particularly important for devices at high voltage that are trying to send information across this high voltage gap as there is a "Corona Cloud" that wraps around this equipment that blocks the transmission of information. Corona is characterized by free electrons and other ions forming a plasma of hot gasses that very effectively blocks RF signals, similar in effect to a wire mesh shield. Importantly, the corona varies cyclically with the power system voltage, reaching its maximum during maximum voltage periods and diminishing to the point of effectively disappearing for a few milliseconds during voltage zero-crossing periods.

Present power line data communication methods transmit data randomly, which causes the transmission to be continually corrupted by the corona effects and detuning of the antennae so that data transmission is reduced as much as 60 percent of time, which renders this type of data transfer quite ineffective. This is becoming quite problematic in the age of trying to build a "Smart Grid." Using an improved technique greatly enhances the reliability of this data transmission and hence the whole transmission system. The present invention solves this problem by timing the data signal transmissions to occur during these low-voltage "windows" between the corona clouds, which significantly increases the range while reducing the power required for reliable data transfers.

Referring now to FIG. 1, an electric power monitoring and response system 10 configured to operate in the presence of high voltage corona. The system is positioned on a high voltage electric power line 12, which in this example includes one or more conductors in each phase A, B and C. While three phase power line monitoring is desired in most cases, it should be noted that the invention is indifferent to the number of phases monitored. For example, a single phase or two phase power line may be monitored or only one or two phases of a three phase power line may be monitored if desired. The phase conductors are supported by a number of transmission line towers represented by the towers 14*a* and 14*b*. While each power line includes a large number of towers and each tower need not include power monitoring equipment, the representative towers are sufficient to illustrate the principles of the invention. In general, the typical tower spacing is well under a mile while the typical communication unit spacing may be in the range of tens of miles. Referring to the tower 14*a* as an example, the electric power monitoring and response system 10 includes power monitoring equipment (power line monitor) 16*a*, which includes a dedicated phase monitor associated with each phase such as a current transformer and one or more voltage sensors directly connected to (typically hanging from) each power line phase.

The phase monitors should usually be located near the towers where the phase conductors are physically supported to avoid adding to the physical sag of the power line between the towers. A communication unit 18*a* is configured to receive the monitoring data from the power line monitor 16*a* and transmit the data, typically to subsequent communication unit in the system represented in this example by the communication unit 18*a* at the tower 14*b*. Each communication unit may receive a cumulative data signal from a prior adjacent communication unit, adds the power line data for its respective monitoring stations, and forwards the augmented package to the next adjacent communication unit in a data-forward configuration. The tower-to-tower communication frequency is typically a moderate (e.g., 325 MHz), moderate power (e.g., 5 W) data link suitable for communicating order of tens of miles (e.g., 20 miles). The individual phase monitors of the power line monitor 16a may be wired to the communication unit 18a or they may communicate wirelessly using a relatively high frequency (e.g., 2.4 GHz), low power (e.g., 5 W) and low range data link suitable across the distances of power line phase separation on the order of tens of meters.

Figure 2:
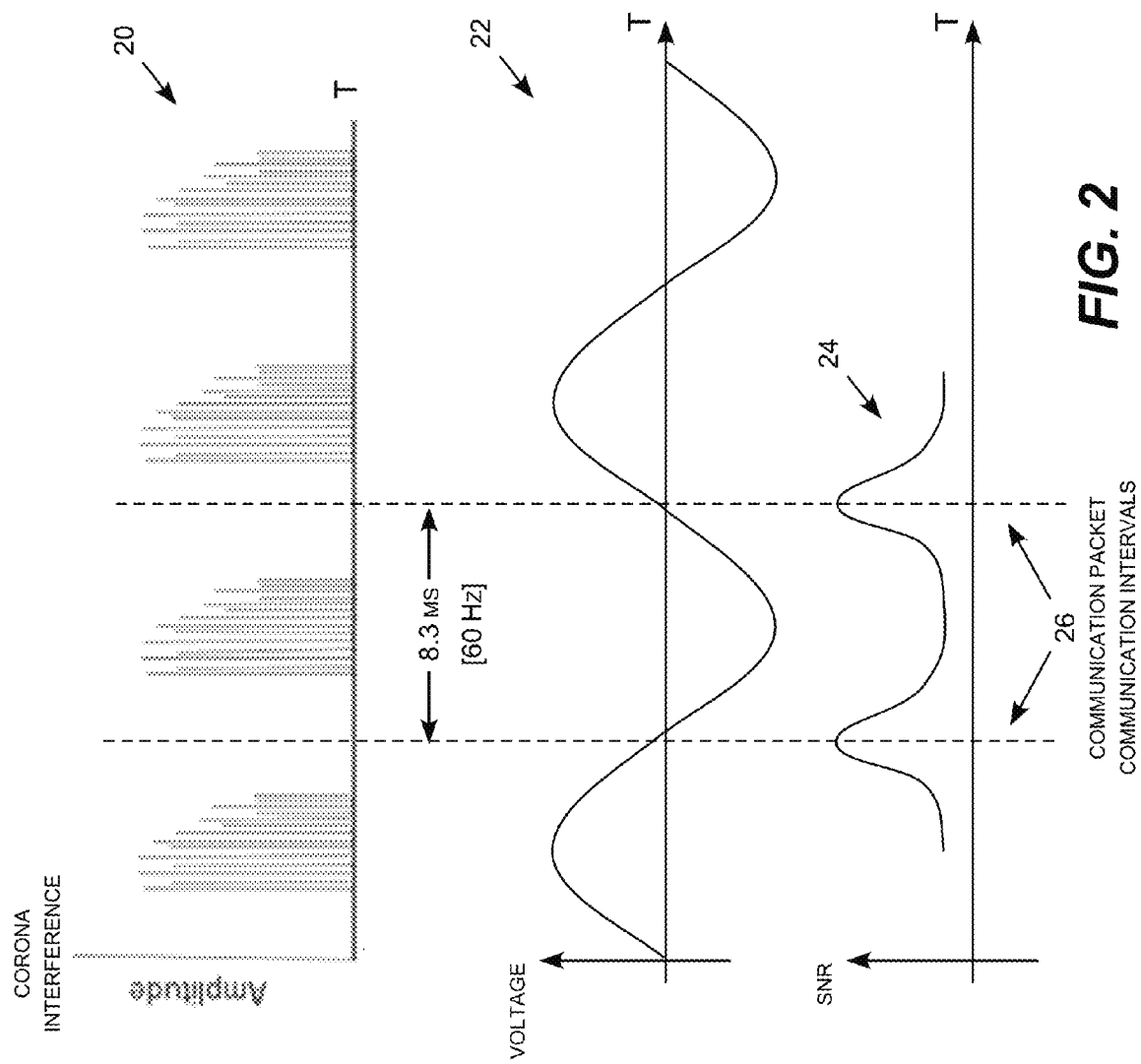
FIG. 2 is a set of graphs illustrating communication packet timing in the system for RF communication in the presence of high voltage corona.

FIG. 2 is a set of graphs illustrating communication packet timing in the RF communication system 10 in the presence of high voltage corona. Graph 20 illustrates the presence of corona generated by the power line, which follows the voltage curve 22 of the electric power on the line. That is, the corona reaches peaks during voltage peaks and subsides to zero during voltage zero crossings, which occur twice each 60 Hz cycle corresponding to low corona intervals every 8.3 ms. The signal-to-noise ratio (SNR) 24 therefore peaks every 8.3 ms providing regular communication intervals 26 for transmitting communication packets when the corona interference is low. The RF communication system 10 therefore transmits data packets during the communication intervals 26 to avoid corona interference that would otherwise interfere with data communication at moderate communications frequencies and power (e.g., 325 MHz at 5 W in the exemplary embodiment).

Figure 3:
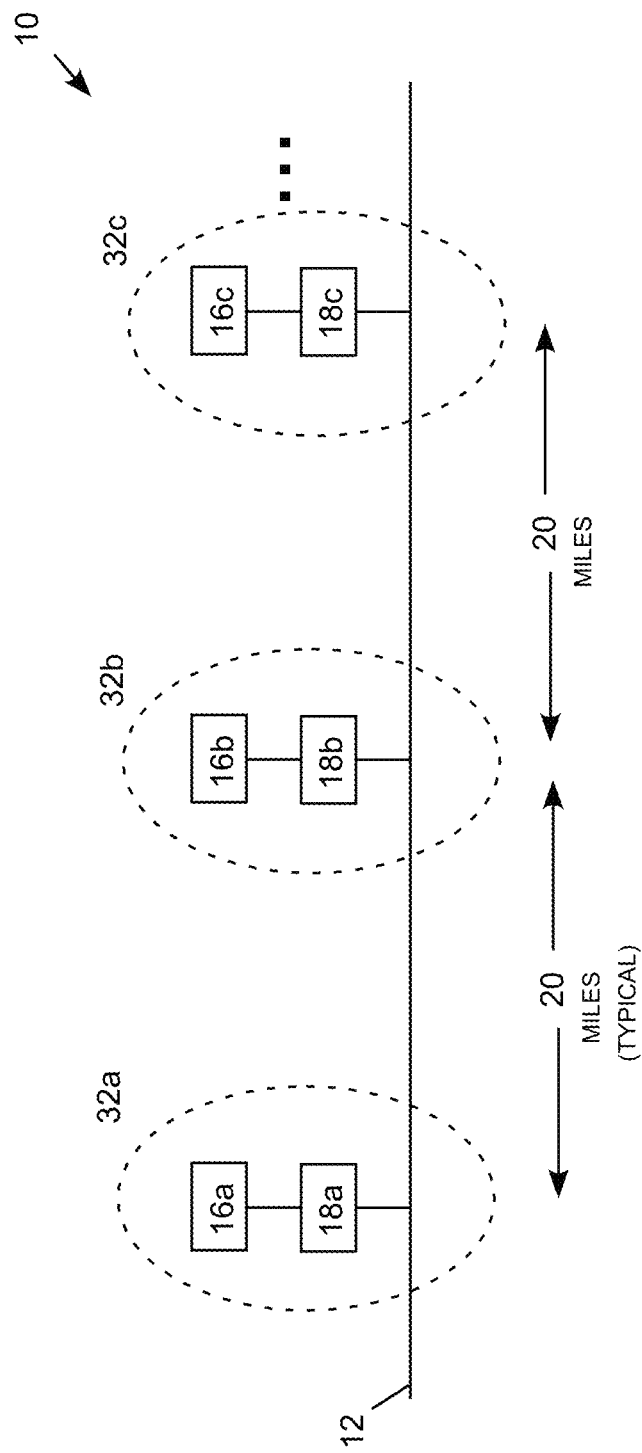
FIG. 3 is a conceptual illustration of typical transmitter spacing in the system for RF communication in the presence of high voltage corona.

FIG. 3 is a conceptual illustration of typical transmitter spacing in the RF communication system 10 in the presence of high voltage corona. This example shows power line monitors 16a, 16b and 16c with transmitters 18a, 18b and 18c located within respective the corona fields 32a, 32b and 32c. By timing the transmission of data packets to correspond to low-corona periods during each cycle (i.e., every 8.3 ms at 60 Hz, every 10 ms at 50 Hz), the distance between the power line monitors and associated data transmitters can be on the order of 20 miles when transmitting in the 325 MHz frequency channel at a moderate power level such as 5 W. This relatively wide transmitter spacing makes it feasible to install a comprehensive set of power line monitors throughout a power system. The data transmitters are typically located on the same phase conductor so that the corona field drop occurs at the same time intervals (in phase) for all of the transmitters. It should also be noted that each data transmitter can determine when low corona events are occurring by detecting the zero-crossing of the voltage in its associated power line. For the purpose of corona avoidance, it is sufficiently accurate to correlate low corona periods with current peaks, which allows the data transmission periods to be conveniently determined from a current transformer measurement on the associated power line regardless of whether a separate voltage measurement is available.

Figure 4:
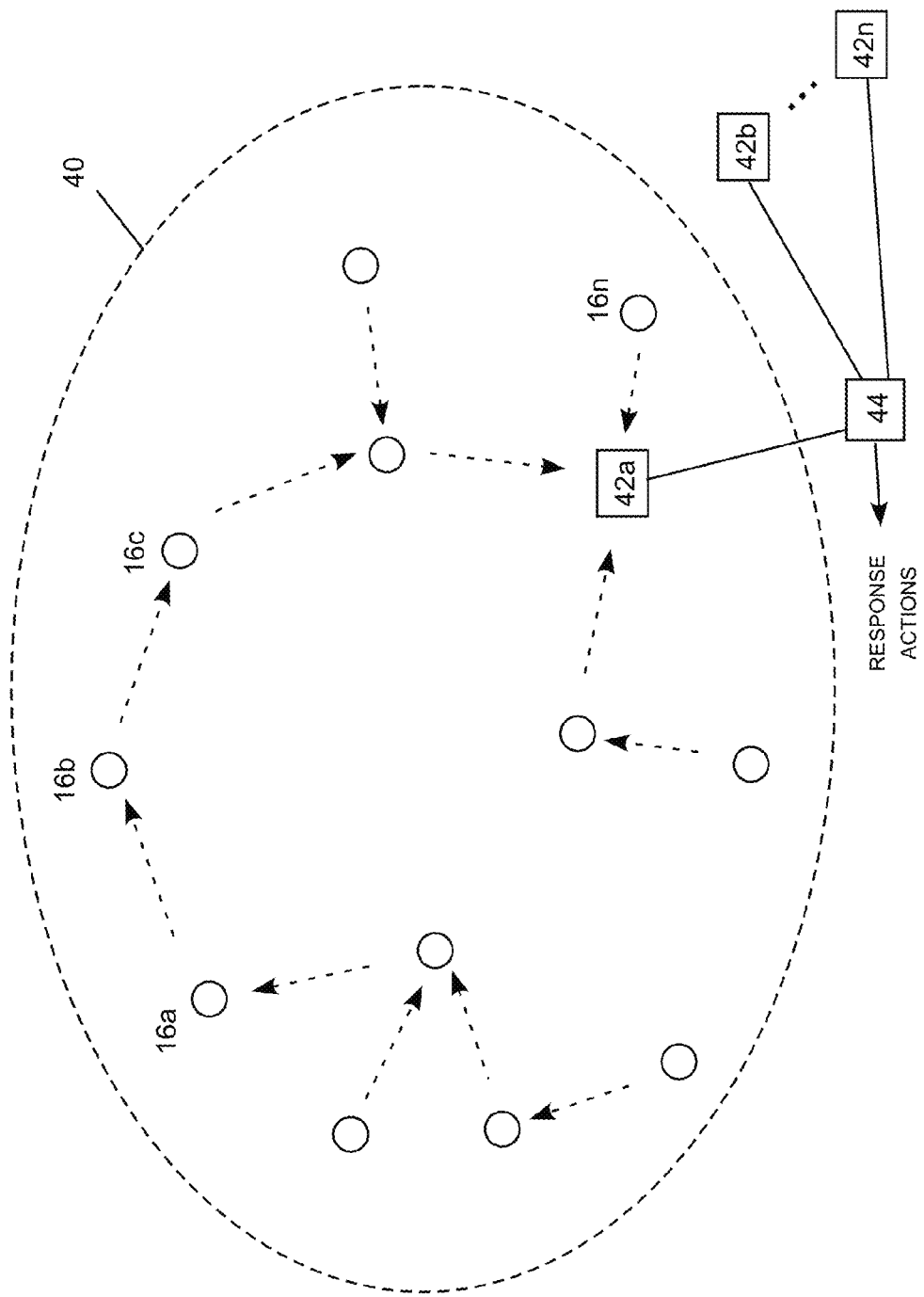
FIG. 4 is a conceptual illustration of a data-forward communication in the system for RF communication in the presence of high voltage corona.

FIG. 4 is a conceptual illustration of a data-forward communication RF communication system 40 in the presence of high voltage corona. In this example, power monitoring stations represented by the enumerated stations 16a-16n transmit data packets in a data-forward convention delivering all of the data monitoring data to a data aggregation waypoint 42a, such as a substation connected to a central monitoring and control center 44. That is, the data transmitter located farthest from the waypoint transmits its data to the next adjacent transmitter, which adds its data and transmits the cumulative date to the next transmitter, and so forth until the complete package reaches the data waypoint. For a loop configuration, the monitoring points are divided into data-forward groups as a matter of design choice so that each data transmitter sends its data, plus any data received from a prior transmitter, forward to a data waypoint.

A number of data aggregation waypoints 42a-n similarly provide power monitoring data to the central control center 44 to provide real-time power monitoring data for all or a portion of the power system. The central control center 44, in turn, may analyze, record, display and respond to the power conditions. For example, the response actions may include dispatching repair crews, operating switching equipment including fault isolation, and activating or deactivating power devices and interchanges, such as power generations stations, interruptable loads, load control switches, capacitor banks, reactors, voltage regulators, and any other actions available in the "smart grid" power system.

Figure 5:
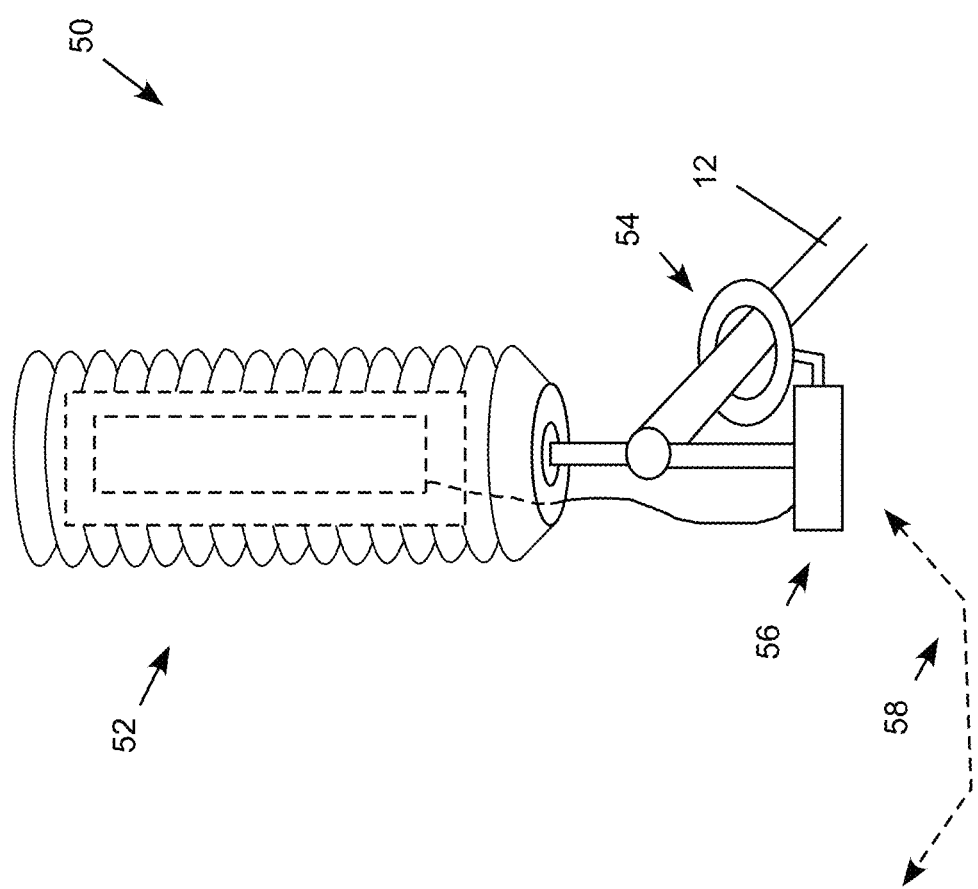
FIG. 5 is a conceptual illustration of voltage and current sensors connected to a data transmitter in the system for RF communication in the presence of high voltage corona.

FIG. 5 is a conceptual illustration of one illustrative type of power line sensors and data transmitter arrangement 50 for the system 10. In this example, a phase voltage sensor 52 is located within a cavity inside a high voltage insulator supporting the monitored power line 12. A ring-type current sensor 54 surrounds the power line 12 to pick up a current measurement. The voltage sensor 52 and current sensor 54 are operatively connected to a data transmitter 56, which hangs from the power line. All three devices 52, 54 and 56 are located within the high voltage field generated by the power line. An interphase communication link 56 brings power line monitoring data from the other power line phase conductors to the data transmitter 56, which transmits three-phase power line data to the next adjacent data transmitter in a data-forward configuration to a data waypoint and ultimately to a control center. A variety of local controllers and control center may analyze the power line data and implement response actions.

FIGS. 6-11 show a compact voltage sensor for use in embodiments of the invention. The voltage sensor is configured to be located within a dielectric canister inside a high voltage power line support insulator. One embodiment provides space through the voltage sensor for a mechanical connecting rod associated with a circuit interrupter switch located in another section of the support insulator. An electrically floating dumbbell-shaped sensor extending between and capacitively coupled to high voltage and low voltage shields assumes a midpoint voltage value between the shields. A sensor plate or other suitable pickup capacitively coupled to the dumbbell sensor provides a voltage measurement, which is calibrated to provide a measurement of the power line voltage. This solution allows a voltage sensor to be added to or integrated in conventionally sized power line support insulators with no additional size, negligible additional weight, and minimal additional cost. As no additional space is required and the cost is low, this type of voltage sensor is suitable for transmission voltage applications as well as a wide range of lower voltage applications where conventional voltage sensors are not presently feasible, such as phase-over-phase power line poles and circuit interrupters widely used at sub-transmission and distribution voltages.

The voltage detector located inside a line insulator includes two stationary voltage shields with one shield at line voltage and the other at ground voltage. The shields are positioned to provide a sufficient gap between them within the dielectric gas inside the insulator to prevent arcing (voltage breakdown) between the shields. That is, the shields extend into the dielectric canister while supporting the voltage stress in the dielectric medium so that the integrity of the system meets the voltage requirements. An electrically floating sensor, typically shaped like a dumbbell with one bell capacitively coupled to each shield and a conductive shaft connecting the bells, extends between the shields. The two large bells are spaced apart from the shields to provide significant capacitance between the bells and the shields to cause the sensor naturally float at the midpoint voltage between the high voltage shield and the grounded shield. These large bells are connected with a relatively small diameter conductive tube that mechanically and electrically connects the bells together. For a circuit interrupter embodiment, the tube has a sufficient diameter to allow the mechanical connecting rod of the interrupter to pass through the center of the connecting tube, which eliminates the need for a separate insulator to house the voltage detector.

The relatively small diameter connecting tube and the positioning of the electric shields relatively close together while still preventing voltage breakdown minimizes the exposed area of this floating sensor to stray voltage. In other words, shields electrically shield the bells from stray voltage, exposing only the relatively small length of the relatively small connection tube external electric fields. This significantly reduces stray capacitive effects between the sensor and other grounded structures or outside voltage sources. Locating the voltage detector inside the dielectric canister of the insulator allows the gap between the shields to be minimized while virtually eliminate environmental effects like rain, pollution, and accumulated crud. Is should be noted that any variation in the voltage gradient within ambient air along the outside surface of the insulator will not affect the driving voltage division between the shields caused by the floating sensor inside the dielectric canister of the insulator. The term "floating" in this sense means that the sensor is suspended within the dielectric gas causing the sensor to be capacitively coupled to the shields rather than being in direct electrical contact (shorted) to either shield, which are maintained at ground and line voltage, respectively.

A sensor plate or other suitable pickup is located adjacent to but spaced apart from the dumbbell-shaped sensor a sufficient distance to be capacitively coupled to the sensor. A wire from the sensor plate provides a sensor output signal that is calibrated to indicate the line voltage. This system is an improvement in that it uses an existing insulator as the housing for the voltage detector. A dielectric insulation system, which already exists for the circuit interrupter alternative, provides for a mechanical connecting rod to pass through the sensor system. The arrangement of the dumbbell shaped floating sensor allows for the signal to be detected without being affected significantly by outside contamination effects that are intrinsic in all voltage measurement systems and hence require either significant error tolerance or very large capacitances between the high voltage and ground of the voltage to be measured.

FIG. 6 is a front view of a phase-over-phase electric power pole 110 providing an illustrative embodiment of the voltage detector located inside a line insulator. The power pole 110 includes three line insulators that each support a phase conductor. The insulator 112 supporting the phase conductor 14 includes an internal voltage detector in this example. While each phase may include a voltage detector, one voltage detector along with current monitors for each phase is typically sufficient for power line monitoring.

FIG. 7 is a conceptual illustration of the voltage detector 120 located inside the line insulator 112. The line insulator 112 includes an internal sealed canister 116 filled with a dielectric medium, such as the dielectric $SF_6$ or another suitable dielectric gas utilized in the electric power industry. Although a dielectric gas is most commonly used, a dielectric foam or liquid could also be utilized. The dielectric canister 116 houses an electrically floating voltage sensor 20 that is capacitively coupled to both the high voltage end 122 and the low voltage end 1124 of the canister 116. This allows the floating voltage sensor 120 to serve as a voltage divider assuming a midpoint voltage between the high voltage end 122 (at line voltage) and the low voltage end 124 (at ground voltage). A signal line that is capacitively coupled to the floating voltage sensor 120 provides a voltage measurement 125 indicative of the voltage of the floating voltage sensor, which is calibrated to provide an indication of the voltage of the line voltage.

The sensor voltage measurement 125 may be connected to hardware or software calibration equipment 126 that may be adjusted to produce a power line voltage measurement 128 based on the sensor voltage measurement 125. Sensor calibration is very well known in the power industry and any suitable type of calibration may be utilized. For example, an analog-to-digital converter and associated op-amp circuitry with a variable resistor may be used to generate a calibrated output signal based on the sensor measurement value. The voltage measurement 125 and/or the power line voltage measurement 128 may then then passed to communication, display and/or control equipment 128 for displaying or operating elements of the power system based on the voltage measurement. Referring again to FIG. 7, for example, the calibration equipment 11126 may be located in a local control box 17, which may also contain local response equipment 128, such as communication equipment for transmitting the voltage measurement to a remote control center 129 that receives a large number of power line measurements for coordinated power system operation. The local response equipment 128 may also include a line disconnect switch and associated actuator that automatically operates in response to a rapid voltage drop and associated current surge characteristic of a line fault. For example, the control box 117 may automatically disconnect and reconnect a faulted line a predefined number of times to allow a passing fault, such as tree limb temporarily faulting the line, to clear naturally before maintaining the disconnection and dispatching a repair crew. Alternatively or additionally, the local response equipment 128 may operate in response to commands from the remote control center 129.

FIG. 8 is a conceptual illustration of an alternative embodiment in which the voltage detector 120 is located inside a hanging line insulator 130, which is often used on high voltage transmission lines. Although automatic switching equipment may be connected to the voltage detector, in this line-mounted embodiment the associated equipment (referred to generally as "response equipment") is typically limited to a calibration and communication unit 115. As an option, a fiber optic cable 132 may also be routed through the voltage sensor.

FIG. 9 is a conceptual illustration of another alternative embodiment in which the voltage detector is located inside a circuit interrupter 140. A phase interrupter 142 includes two insulators 144 and 146 that each house internal dielectric canisters. The upper canister 144 contains the interrupter mechanism, while the lower canister 146 contains the voltage detector 120 which is configured to accommodate the connecting rod driven by the actuator mechanism 148 that drives the interrupter mechanism. The voltage detector located within the lower insulator 146 is configured to accommodate and occupy the same dielectric canister as the connecting rod.

FIG. 10 is a sectional view of the circuit interrupter 142 showing the internal location of the voltage detector located 120 within the circuit interrupter. The upper insulator 144 houses the interrupter mechanism 150, while the lower insulator 146 houses the connecting rod 152. As noted above, the voltage detector 120 located within the lower insulator 146 is configured to accommodate and occupy the same dielectric canister as the connecting rod 152. While this configuration is adapted for a circuit interrupter, the same sensor structure may be used for alternative embodiments that do not have to accommodate a connection rod, although the connecting rod may be smaller in diameter and/or solid in these other embodiments.

Figure 11:
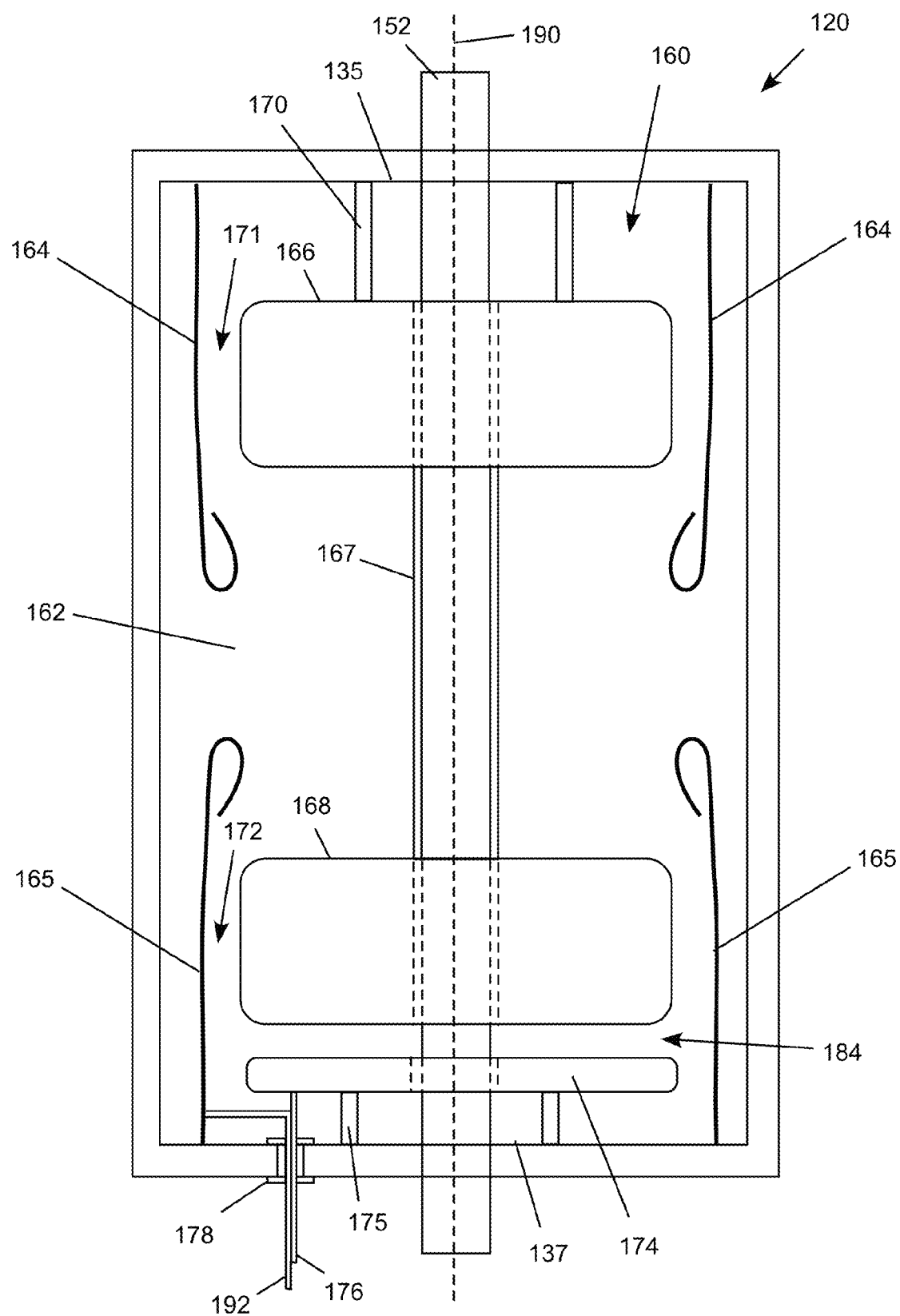
FIG. 11 is a sectional view showing the configuration of the voltage detector located inside a circuit interrupter.

FIG. 11 is a sectional view showing the configuration of the voltage detector 20 located inside the circuit interrupter accommodating the connecting rod 152 passing through the center of the voltage detector. The voltage detector 120 includes a floating sensor 1160 located within a dielectric canister filled with a dielectric gas 162. The canister extends from a high voltage end 135 maintained at line voltage to a low voltage end 137 maintained at ground voltage. A hollow, cylindrical high voltage shield 164 maintained at line voltage extends from the high voltage end 135 into the canister, while a low voltage shield 165 maintained at ground voltage extends from the low voltage end 137 into the canister. The electrically floating sensor 160 is dumbbell shaped with opposing upper and lower bells 166, 68 separated by a hollow tube 167 sized to receive the connecting rod 152. The sensor 160 may be hollow, thin and light constructed from a conductive material, such as sheet steel or aluminum. The shields 164, 166 may likewise be thin and light constructed from a conductive material, such as sheet steel or aluminum with a rolled edge within the canister to reduce the voltage stress.

The sensor 1160 is suspended from an insulator support 70 (typically a concentric cylindrical section) to position the sensor in the center of the dielectric canister midway between the high voltage end 135 and the low voltage end 137. The upper bell 166 is positioned with a gap 171 between the upper bell and the high voltage shield 164 sufficient to prevent voltage breakdown across the gap while capacitively coupling the upper bell 1166 to the high voltage shield 164. Similarly, lower bell 68 is positioned with a gap 72 between the lower bell and the low voltage shield 165 sufficient to prevent voltage breakdown across the gap while capacitively coupling the lower bell 168 to the low voltage shield 165. A sensor plate 174 is positioned by an insulator support 175 (typically a concentric cylindrical section) adjacent to the lower bell 168. A gap 184 between the sensor plate 174 and the lower bell 168 prevent voltage breakdown across the gap while capacitively coupling the sensor plate 174 to the lower bell 168. A signal line 176 extends from the sensor plate 174 through a seal 178 in the dielectric canister to deliver the voltage measurement outside the insulator, where it calibrated and connected to communication and control equipment. As an option, a second signal line 192 connected to the adjacent shield 165 may also be provided as a component of the voltage measurement signal. In situations where the shield is grounded, however, a separate signal line for the reference voltage is not necessary. As another option, a fiber optic cable 190 may be routed through the voltage sensor, for example through the center of a hollow connecting rod 152.

Figure 12:
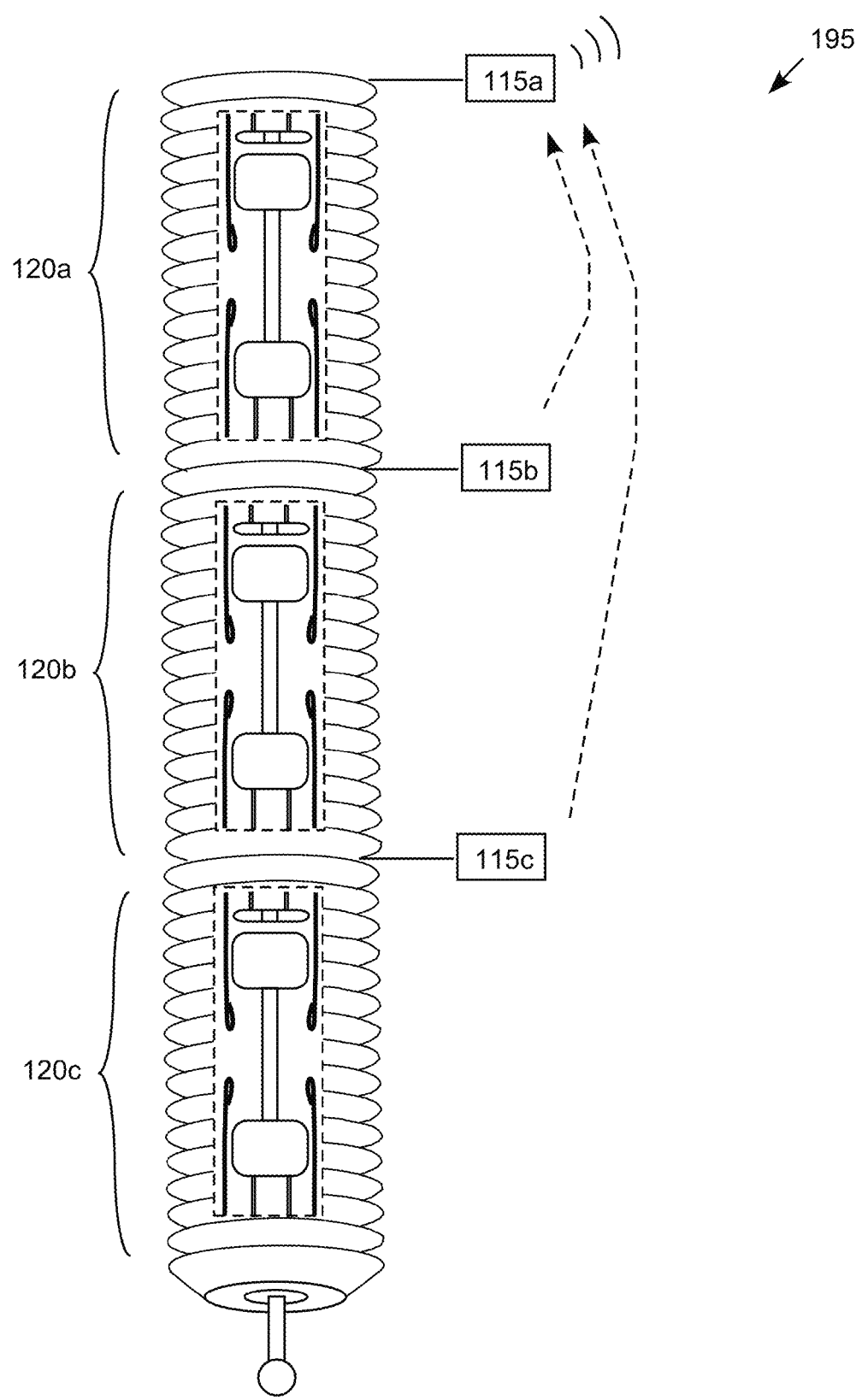
FIG. 12 is a conceptual illustration of an extra high voltage power line insulator containing three cascaded voltage detectors within the power line insulator.

FIG. 12 is a conceptual illustration of an extra high voltage power line insulator 195 containing three cascaded voltage detectors within the line power insulator. As described above, with reference to FIG. 11, a second signal line 192 connected to the adjacent shield 165 may also be provided as a component of the voltage measurement signal. While this option is not usually necessary in an embodiment with a single voltage detection where the low voltage shield is grounded, it is utilized in the cascaded embodiment shown in FIG. 11. This approach is suitable for extra high voltage applications (e.g., 240 kV, 345 kV, 500 kV and 750 kV utilized in some parts of the U.S. and comparable voltages utilized elsewhere) in which the power line insulators as sufficiently long to render a single floating voltage detector unwieldy. To illustrate this situation for the insulator 195, multiple voltage detectors 120a-c are cascaded within the insulator. Each detector is typically located within a separate dielectric canister within a separable section of the insulator. This produces a modular design in which the shield one end of the cascade is connected to line voltage, the shield on the opposing end of the cascade is connected to ground, and the intervening shields are floating. An additional signal line measuring the reference voltage of a floating shield is therefore utilized for the intervening shields. Each section also includes its own calibration and communication unit 115a-115c with one of the units receiving the voltage signals from the other detectors, assembling and communicating a package for the overall voltage detector 195. With this approach, it becomes cost effective to include voltage detectors for each phase of as many high voltage towers as desired, which aids a wide range of "smart grid" operations and fault isolation techniques.

The power line data collection and communication techniques employed by the invention to avoid corona interference is indifferent to the specific type of power line sensors used, the specific type of data collected, the specific data forward network layout, the type of SCADA or other communication system used to integrate the waypoints with the control center, the type of analysis applied to the power line data, and the specific types of response actions. The corona-avoidance techniques may therefore be employed with any suitable of sensors, transmitters, analysis techniques and response equipment. Regardless of these specifics, the invention provides for a more robust system of distributed power monitoring stations where power line monitoring is feasible throughout the power grid from the highest backbone transmission voltages down to distribution voltages. This type of complete grid monitoring is a critical feature of an overall smart grid system.

To provide some illustrative examples of the technologies that may be combined with the corona-avoidance data transmitters into a larger smart grid system in accordance with the invention, an example of a compact power line voltage sensor is described with reference to FIGS. 6-12 above. An example of a compact power line current sensor for a circuit interrupter is described in commonly owned U.S. application Ser. No. 14/104,932 (U.S. Pub. No. 2014-0160612); which is incorporated by reference. Example circuit switchers and associated response equipment are described in commonly-owned U.S. Pat. Nos. 6,236,010; 6,316,742; 6,483,679; 6,583,978; 7,078,643; 7,115,828; 7,745,753; 8,063,333; 8,274,007; 8,541,702; and commonly-owned U.S. application Ser. Nos. 14/104,875; 14/050,476, which are also incorporated by reference. This application further incorporates by reference the disclosures of commonly-owned U.S. Pat. Nos. 6,750,563; 7,192,074; 7,476,823; 7,683,798; 8,392,130; and commonly-owned U.S. application Ser. Nos. 13/229,808; 13/229,095; 13/217, 318; and Ser. No. 13/864,611, which provide some examples of power line monitoring, analysis and fault isolation response techniques. Although these examples of representative the types of technologies in the smart grid system according to the invention, those skilled in the art will understand that other types of components can be integrated into the system in accordance with the teachings of the invention.

Those skilled in the art will appreciate that the foregoing describes preferred embodiments of the invention and that many adjustments and alterations will be apparent to those skilled in the art within the spirit and scope of the invention as defined by the appended claims.

The invention claimed is:

1. An electric power line monitoring and response system for an electric power line carrying an electric power waveform experiencing periodic low voltage periods associated with voltage zero-crossings, comprising:
a plurality power line monitors, each located within the high voltage field of an associated conductor of the power line and configured to measure power line monitoring data corresponding to its respective conductor;
a plurality of power line data transmitters, each located within the high voltage field of an associated high voltage conductor, operably connected to a respective power line monitor, and configured to receive, store and transmit the power line monitoring data from a respective power line monitor, and
wherein each power line data transmitter is configured to detect the low voltage periods and transmit the power line monitoring data only during the low voltage periods to minimize corona interference with the transmission.

2. The system of claim 1, wherein the data transmitters send the power line monitoring data at a relatively moderate RF frequency under about 2.0 GHz.

3. The system of claim 2, wherein the data transmitters send the power line monitoring data at about 325 MHz.

4. The system of claim 1, wherein each power line monitor comprises a plurality of phase monitors, each associated with a separate phase conductor of the power line, configured to transmit phase power line monitoring data to an associated data transmitter, which transmits multi-phase power line monitoring data during the low voltage periods to minimize corona interference with the transmission.

5. The system of claim 4, wherein the phase monitors are operably connected to their associated data transmitter by a conductor or a relatively high frequency RF channel operating above about 2.0 GHz.

6. The system of claim 1, wherein the power line data transmitters are configured to transmit cumulative power line data in a data-forward configuration to a data waypoint.

7. The system of claim 1, wherein:
groups of the power line data transmitters are each configured to transmit cumulative power line data in a data-forward configuration to a data waypoint; and
the data waypoints are each configured to transmit cumulative power monitoring data from its respective group of power line data transmitters to a control center.

8. The system of claim 1, further comprising response equipment and configured to operate the response equipment based at least in part on the power line monitoring data.

9. The system of claim 8, wherein the response equipment includes one or more of switching equipment operated to isolate a fault detected through analysis of the power line monitoring data, capacitor banks, voltage regulators, power interchanges, distributed generators, load control switches, and interruptable loads.

10. An electric power system comprising:
a control center,
a plurality of substations operatively connected to communicate power monitoring data to the control center;
a plurality of electric power lines interconnecting the substations and loads into an electric power grid, the power grid carrying an electric power waveform experiencing periodic low voltage periods associated with voltage zero-crossings;
a plurality power line monitors, each located within the high voltage field of an associated conductor of the power grid and configured to measure power line monitoring data corresponding to its respective conductor;
a plurality of power line data transmitters, each located within the high voltage field of an associated high voltage conductor, operably connected to a respective power line monitor, and configured to receive, store and transmit the power line monitoring data from a respective power line monitor, and
a plurality of data monitoring waypoints, each operatively connected to a substation,
wherein groups of the power line data transmitters are each configured to transmit cumulative power line data in a data-forward configuration to a data waypoint, and the data waypoints are each configured to transmit cumulative power monitoring data from its respective group of power line data transmitters to the control center; and
wherein each power line data transmitter is configured to detect the low voltage periods and transmit the power line monitoring data only during the low voltage periods to minimize corona interference with the transmission.

11. The system of claim 10, wherein the data transmitters send the power line monitoring data at a relatively moderate RF frequency under about 2.0 GHz.

12. The system of claim 11, wherein the data transmitters send the power line monitoring data at about 325 MHz.

13. The system of claim 10, wherein each power line monitor comprises a plurality of phase monitors, each associated with a separate phase conductor of the power line, configured to transmit phase power line monitoring data to an associated data transmitter, which transmits multi-phase power line monitoring data during the low voltage periods to minimize corona interference with the transmission.

14. The system of claim 13, wherein the phase monitors are operably connected to their associated data transmitter by a conductor or a relatively high frequency RF channel operating above about 2.0 GHz.

15. The system of claim 10, further comprising response equipment and configured to operate the response equipment based at least in part on the power line monitoring data.

16. The system of claim 15, wherein the response equipment includes one or more of switching equipment operated to isolate a fault detected through analysis of the power line monitoring data, capacitor banks, voltage regulators, power interchanges, distributed generators, load control switches, and interruptable loads.

17. A system for monitoring a power line, comprising:
a plurality of means for measuring electric power data associated with the power line, each located within a high voltage field of an associated conductor of the power line and configured to measure power line monitoring data corresponding to its respective conductor;

a plurality of means for transmitting the electric power data, each located within the high voltage field of an associated high voltage conductor, operably connected to a respective means for measuring electric power data, and configured to receive, store and transmit the power line monitoring data from a respective power line monitor, and means for detecting low voltage periods and transmitting the power line data only during the low voltage periods to minimize corona interference with the transmission.

18. The system of claim 17, wherein the means for transmitting the electric power data are configured to transmit cumulative power line data in a data-forward configuration to a data waypoint.

19. The system of claim 18, further comprising:
means for analyzing the power line monitoring data; and
means for operating response equipment of the power line in response at least in part to the power line monitoring data.

20. The system of claim 19, wherein the response equipment includes one or more of switching equipment operated to isolate a fault detected through analysis of the power line monitoring data, capacitor banks, voltage regulators, power interchanges, distributed generators, load control switches, and interruptable loads.

\* \* \* \* \*